(12) United States Patent
Xiao

(10) Patent No.: US 9,972,543 B2
(45) Date of Patent: *May 15, 2018

(54) COMPLEMENTARY NANOWIRE SEMICONDUCTOR DEVICE AND FABRICATION METHOD THEREOF

(71) Applicant: ZING SEMICONDUCTOR CORPORATION, Shanghai (CN)

(72) Inventor: Deyuan Xiao, Shanghai (CN)

(73) Assignee: Zing Semiconductor Corporation, Shanghai (CN)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/587,484

(22) Filed: May 5, 2017

(65) Prior Publication Data

US 2017/0256461 A1  Sep. 7, 2017

Related U.S. Application Data

(63) Continuation of application No. 15/268,164, filed on Sep. 16, 2016, now Pat. No. 9,779,999.

(30) Foreign Application Priority Data

Mar. 3, 2016 (CN) .......................... 2016 1 0120564

(51) Int. Cl.
*H01L 27/12* (2006.01)
*H01L 21/8238* (2006.01)
(Continued)

(52) U.S. Cl.
CPC .. *H01L 21/823807* (2013.01); *H01L 21/0262* (2013.01); *H01L 21/02532* (2013.01);
(Continued)

(58) Field of Classification Search
CPC ....... H01L 21/823807; H01L 21/02532; H01L 21/02546; H01L 21/02603; H01L 21/0262;
(Continued)

(56) References Cited

U.S. PATENT DOCUMENTS

2008/0001169 A1* 1/2008 Lochtefeld .......... H01L 21/2018 257/190
2014/0197377 A1   7/2014 Kim et al.
(Continued)

*Primary Examiner* — Yosef Gebreyesus
(74) *Attorney, Agent, or Firm* — Huffman Law Group, PC

(57) ABSTRACT

Present embodiments provide for a complementary nanowire semiconductor device and fabrication method thereof. The fabrication method comprises providing a substrate, wherein the substrate has a NMOS active region, a PMOS active region and a shallow trench isolation (STI) region; forming a plurality of first hexagonal epitaxial wires on the NMOS active region and the PMOS active region by selective epitaxially growing a germanium (Ge) crystal material; selectively etching the substrate to suspend the pluralities of first hexagonal epitaxial wires on the substrate; forming a plurality of second hexagonal epitaxial wires on the NMOS active region by selective epitaxially growing a III-V semiconductor crystal material surrounding the pluralities of first hexagonal epitaxial wires on the NMOS active region; depositing a dielectric material on the pluralities of first hexagonal epitaxial wires and the pluralities of second hexagonal epitaxial wires, wherein the dielectric material covers the pluralities of first hexagonal epitaxial wires and the pluralities of second hexagonal epitaxial wires; and depositing a conducting material on the dielectric material for forming a gate electrode surrounding the pluralities of first hexagonal epitaxial wires and the pluralities of second hexagonal epitaxial wires, wherein the pluralities of first hexagonal epitaxial wires are a plurality of first (Continued)

nanowires and the pluralities of second hexagonal epitaxial wires are a plurality of second nanowires.

7 Claims, 5 Drawing Sheets

(51) Int. Cl.
　　　H01L 21/02　　　(2006.01)
　　　H01L 27/092　　　(2006.01)
　　　H01L 29/06　　　　(2006.01)
　　　H01L 29/423　　　(2006.01)
　　　H01L 29/786　　　(2006.01)
(52) U.S. Cl.
　　　CPC .. *H01L 21/02546* (2013.01); *H01L 21/02603* (2013.01); *H01L 21/02631* (2013.01); *H01L 21/823878* (2013.01); *H01L 27/092* (2013.01); *H01L 29/0649* (2013.01); *H01L 29/0673* (2013.01); *H01L 29/42392* (2013.01); *H01L 29/78681* (2013.01); *H01L 29/78684* (2013.01); *H01L 29/78696* (2013.01)
(58) Field of Classification Search
　　　CPC ....... H01L 21/02631; H01L 21/823828; H01L 21/823878; H01L 29/0649; H01L 29/0673; H01L 29/42392; H01L 29/78681
　　　See application file for complete search history.

(56) References Cited

U.S. PATENT DOCUMENTS

2015/0236051 A1\* 8/2015 Loubet ................ H01L 27/1211
　　　　　　　　　　　　　　　　　　　　　　　　　　257/347
2015/0249139 A1　　9/2015 Cheng et al.

\* cited by examiner

COMPLEMENTARY NANOWIRE SEMICONDUCTOR DEVICE AND FABRICATION METHOD THEREOF

CROSS-REFERENCE TO RELATED APPLICATIONS

This application is a continuation of co-pending U.S. patent application Ser. No. 15/268,164 entitled COMPLEMENTARY NANOWIRE SEMICONDUCTOR DEVICE AND FABRICATION METHOD THEREOF, having a common assignee and common inventors, and filed on Sep. 16, 2016.

INCORPORATION BY REFERENCE

This application claims priority to P.R.C. Patent Application No. 201610120564.8, titled "Complementary nanowire semiconductor device and fabrication method thereof," filed Mar. 3, 2016, with the State Intellectual Property Office of the People's Republic of China (SIPO).

TECHNICAL FIELD

The present disclosure relates to a complementary nanowire semiconductor device and fabrication method thereof.

BACKGROUND

With mobile device product advancing all the time and process technology improving constantly, miniaturization for product size is of most concern for technology, such as metal-oxide-semiconductor field-effect transistor (MOSFET), which is miniaturized constantly. However, the miniaturization of the transistor derived many limitations and problems physically, such as hot-carrier injection, leakage current, insulation, short-channel effect and channel length control, such that the ability of the gate of the transistor to control the channel is gradually decreased.

Therefore, to solve the problems resulting from miniaturization of the transistor, multi-gate transistor is introduced to improve the ability of the gate to control the channel. Common multi-gate transistor is tri-gate transistor or gate-all-around transistor manufactured on the silicon substrate. However, the mobility of three-dimension isolation channel device still needs to be improved.

The prior technology, such as US publication No. US20100164101, disclosed that silicon germanium epitaxy wires surround the top of fin portion, so that the silicon germanium epitaxy wires are epitaxy wires with silicon core. Although the germanium nanowire could be formed by subsequent oxidation anneal process step to aggregate germanium to the center, the core has high silicon content, that is the nanowire has low germanium content, so as to affect the performance of the semiconductor device.

SUMMARY

Thus an object of the present invention is to provide a complementary nanowire semiconductor device and fabrication method thereof.

To solve above mentioned problems, the fabrication method of a complementary nanowire semiconductor device comprises the steps of: providing a substrate, wherein the substrate has a NMOS active region, a PMOS active region and a shallow trench isolation (STI) region; forming a plurality of first hexagonal epitaxial wires on the NMOS active region and the PMOS active region by selective epitaxially growing a germanium (Ge) crystal material on the NMOS active region and the PMOS active region; selectively etching the substrate to suspend the pluralities of first hexagonal epitaxial wires on the substrate; forming a plurality of second hexagonal epitaxial wires on the NMOS active region by selective epitaxially growing a III-V semiconductor crystal material surrounding the pluralities of first hexagonal epitaxial wires on the NMOS active region; depositing a dielectric material on the pluralities of first hexagonal epitaxial wires and the pluralities of second hexagonal epitaxial wires, wherein the dielectric material covers the pluralities of first hexagonal epitaxial wires and the pluralities of second hexagonal epitaxial wires; and depositing a conducting material on the dielectric material for forming a gate electrode surrounding the pluralities of first hexagonal epitaxial wires and the pluralities of second hexagonal epitaxial wires, wherein the pluralities of first hexagonal epitaxial wires are a plurality of first nanowires and the pluralities of second hexagonal epitaxial wires are a plurality of second nanowires.

In an aspect of the present disclosure, the pluralities of first hexagonal epitaxial wires are in prismatic shape.

In an aspect of the present disclosure, the step of forming the pluralities of first hexagonal epitaxial wires comprises: the length of each first hexagonal epitaxial wire is between 2 nm and 50 nm.

In an aspect of the present disclosure, the step of forming the pluralities of first hexagonal epitaxial wires comprises: the diameter of each first hexagonal epitaxial wire is between 2 nm and 5 nm.

In an aspect of the present disclosure, the step of selective epitaxially growing the Ge crystal material on the NMOS active region and the PMOS active region comprises: the Ge crystal material is grown by chemical vapor deposition (CVD) process, molecular-beam epitaxy (MBE) process, or atomic layer deposition (ALD) process.

In an aspect of the present disclosure, the step of forming the pluralities of first hexagonal epitaxial wires comprises: the pluralities of first hexagonal epitaxial wires are a plurality of Ge nanowires.

In an aspect of the present disclosure, the percentage of the Ge content in the pluralities of Ge nanowires is between 65% and 100%.

In an aspect of the present disclosure, the step of selective epitaxially growing the III-V semiconductor crystal material surrounding the pluralities of first hexagonal epitaxial wires on the NMOS active region comprises: the III-V semiconductor crystal material is Indium Gallium Arsenide (InGaAs).

In an exemplary embodiment, a complementary nanowire semiconductor device is provided. The complementary nanowire semiconductor device comprises a substrate, wherein the substrate has a NMOS active region, a PMOS active region and a shallow trench isolation (STI) region; a germanium (Ge) crystal material, formed on the NMOS active region and the PMOS active region as a plurality of first hexagonal epitaxial wires; a III-V semiconductor crystal material, wherein the III-V semiconductor crystal material surrounding the pluralities of first hexagonal epitaxial wires on the NMOS active region as a plurality of second hexagonal epitaxial wires; a dielectric material, wherein the dielectric material covers the pluralities of first hexagonal epitaxial wires and the pluralities of second hexagonal epitaxial wires; and a conducting material, wherein the conducting material covers the dielectric material for forming a gate electrode surrounding the pluralities of first hexagonal epitaxial wires and the pluralities of second hexagonal epitaxial wires, and the pluralities of first hexagonal epitaxial wires are a plurality of first nanowires and the pluralities of second hexagonal epitaxial wires are a plurality of second nanowires.

In an aspect of the present disclosure, the pluralities of first hexagonal epitaxial wires are in prismatic shape.

In an aspect of the present disclosure, the length of each first hexagonal epitaxial wire is between 2 nm and 50 nm.

In an aspect of the present disclosure, the diameter of each first hexagonal epitaxial wire is between 2 nm and 5 nm.

In an aspect of the present disclosure, the pluralities of first hexagonal epitaxial wires are a plurality of Ge nanowires.

In an aspect of the present disclosure, the percentage of the Ge content in the pluralities of Ge nanowires is between 65% and 100%.

In an aspect of the present disclosure, the III-V semiconductor crystal material is Indium Gallium Arsenide (InGaAs).

Aforesaid exemplary embodiments are not limited and could be selectively incorporated in other embodiments described herein.

BRIEF DESCRIPTION OF THE DRAWINGS

Exemplary embodiments will be more readily understood from the following detailed description when read in conjunction with the appended drawing, in which.

DETAILED DESCRIPTION

The following detailed description in conjunction with the drawings of a complementary nanowire semiconductor device and fabrication method thereof of the present invention represents the preferred embodiments. It should be understood that the skilled in the art can modify the present invention described herein to achieve advantageous effect of the present invention. Therefore, the following description should be understood as well known for the skilled in the art, but should not be considered as a limitation to the present invention.

The kernel idea of the present invention is to provide the complementary nanowire semiconductor device and fabrication method thereof, in which all-around gate on the PMOS active region is surrounded germanium (Ge) nanowires, and all-around gate on the NMOS active region is surrounded III-V nanowires, such that Ge nanowires has high Ge content to achieve high-mobility channel with good electrostatic control.

Figure 1:
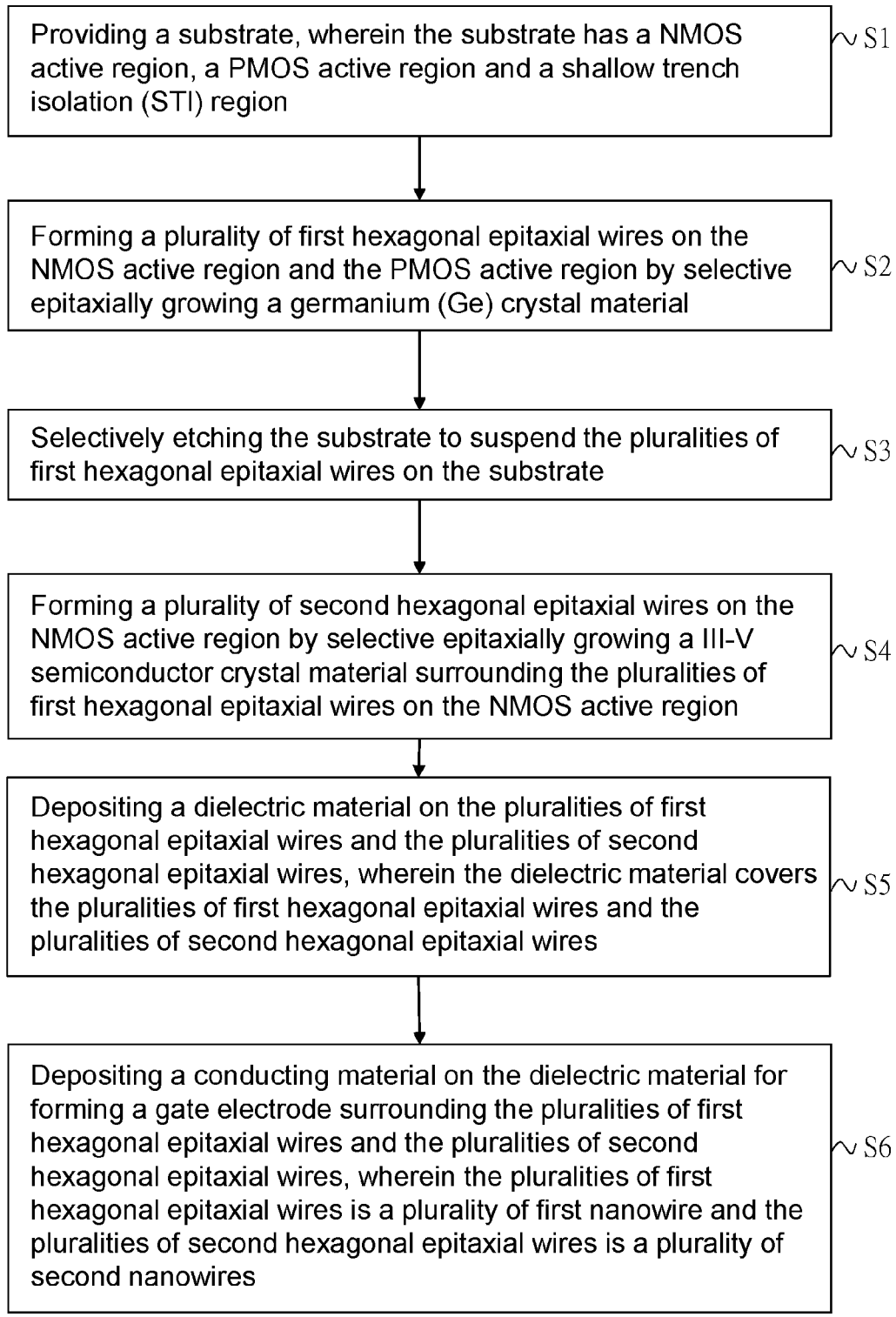
FIG. 1 is a flow chart of a fabrication method of a complementary nanowire semiconductor device according to one embodiment of the present disclosure.
Figure 2:
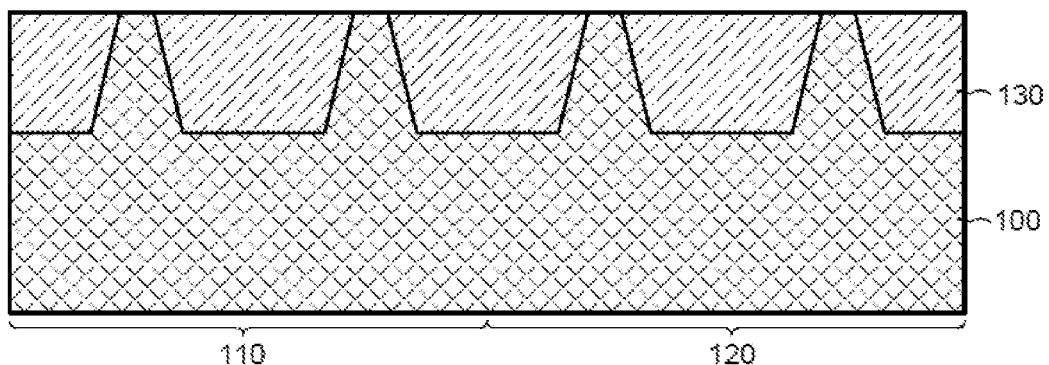
FIG. 2 is a cross-sectional view showing the substrate according to one embodiment of the present disclosure.

The following descriptions in conjunction with the drawings describe the complementary nanowire semiconductor device and fabrication method thereof. FIG. 1 is a flow chart of a fabrication method of a complementary nanowire semiconductor device according to one embodiment of the present disclosure, and FIG. 2 to FIG. 9 are cross-sectional views showing each step respectively according to one embodiment of the present disclosure, in which the method comprises:

Performing step S1: Referring to FIG. 2, providing a substrate 100, in which the substrate 100 has a PMOS active region 110, a NMOS active region 120 and a shallow trench isolation (STI) region 130. In one embodiment, the substrate 100 is a monocrystalline silicon substrate, the PMOS active region 110 and the NMOS active region 120 are in fin shape, and STI region 130 isolates the PMOS active region 110 and the NMOS active region 120.

Figure 3:
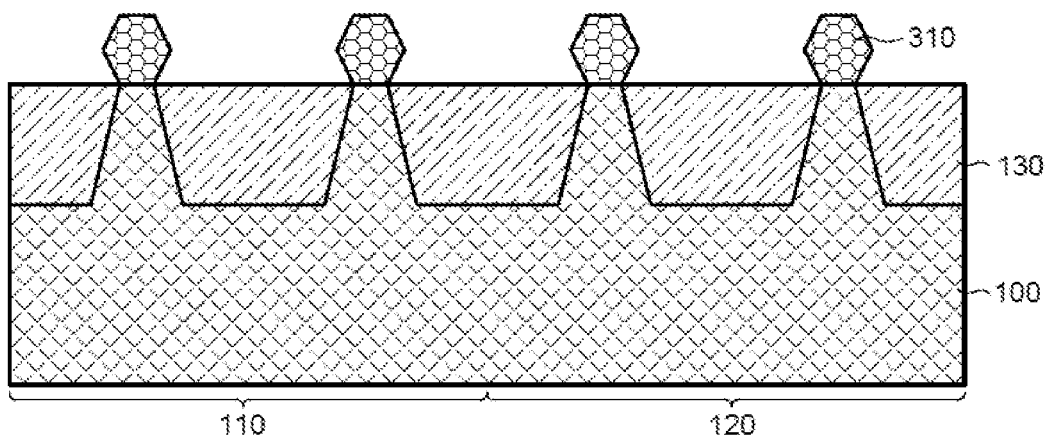
FIG. 3 is a cross-sectional view showing forming a plurality of first hexagonal epitaxial wires on the NMOS active region and the PMOS active region according to one embodiment of the present disclosure.

Performing step S2: Referring to FIG. 3, forming a plurality of first hexagonal epitaxial wires 310 on the PMOS active region 110 and the NMOS active region 120 by selective epitaxially growing a germanium (Ge) crystal material. In one embodiment, the Ge crystal material is grown by chemical vapor deposition (CVD) process, metal-organic chemical vapor deposition (MOCVD) process, molecular-beam epitaxy (MBE) process, or atomic layer deposition (ALD) process. In one embodiment, each one of first hexagonal epitaxial wires is formed on the top of each fin of the PMOS active region 110 and the NMOS active region 120 as a first nanowire. The pluralities of first hexagonal epitaxial wires 310 are in prismatic shape, such as in hexagonal shape. In one embodiment, the length of each first hexagonal epitaxial wire 310 is between 2 nm and 50 nm.

Figure 4:
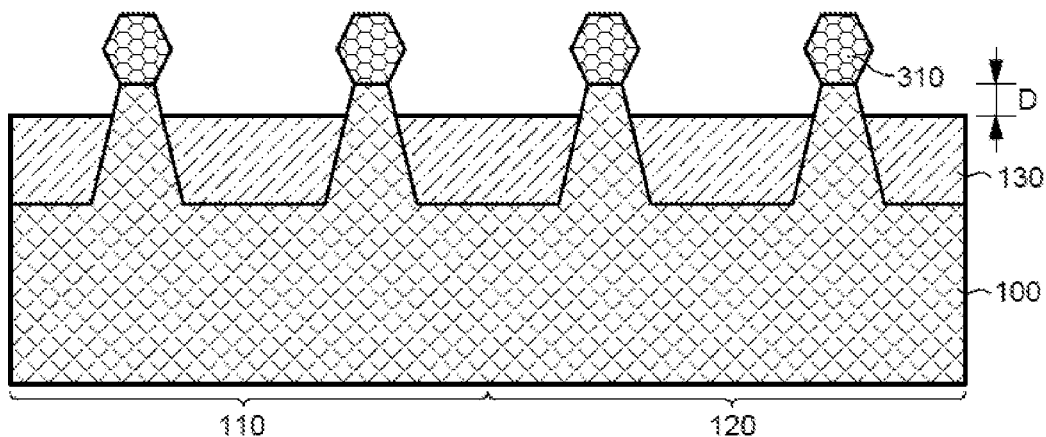
FIG. 4 and FIG. 5 are cross-sectional views showing selectively etching the substrate according to one embodiment of the present disclosure.
Figure 5:
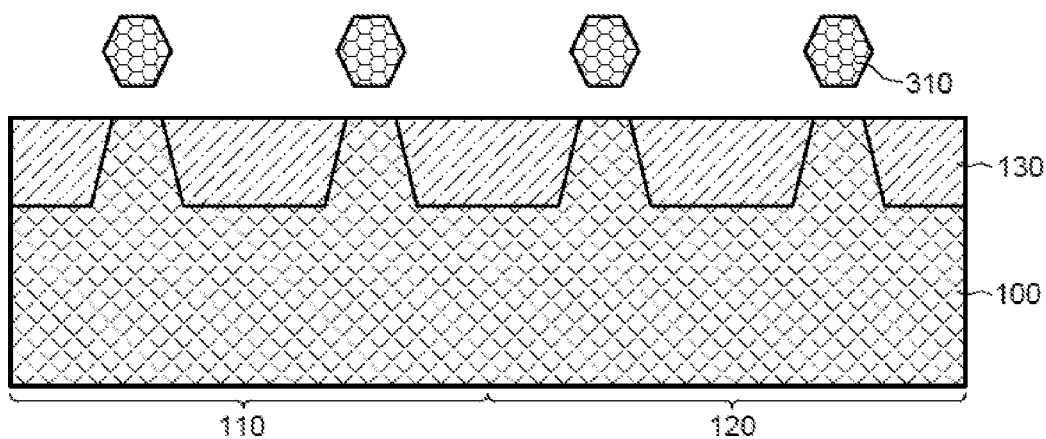

Performing step S3: Referring to FIG. 4 and FIG. 5, selectively etching the substrate 100 to suspend the pluralities of first hexagonal epitaxial wires 310 on the substrate 100. In one embodiment, the STI region 130 is etched selectively to a predetermined depth D (as shown in FIG. 4) by a first etching process, and then the top of the each fin of the PMOS active region 110 and the NMOS active region 120 is etched selectively by a second etching process, such that the pluralities of first hexagonal epitaxial wires 310 are suspended on the substrate 100. In one embodiment, the second etching process is wet etching, in which the etching solution applied in the wet etching is a solution of tetramethylazanium hydroxide (TMAH). In one embodiment, the structure of each first hexagonal epitaxial wire 310 is presented as a cantilever.

Figure 6:
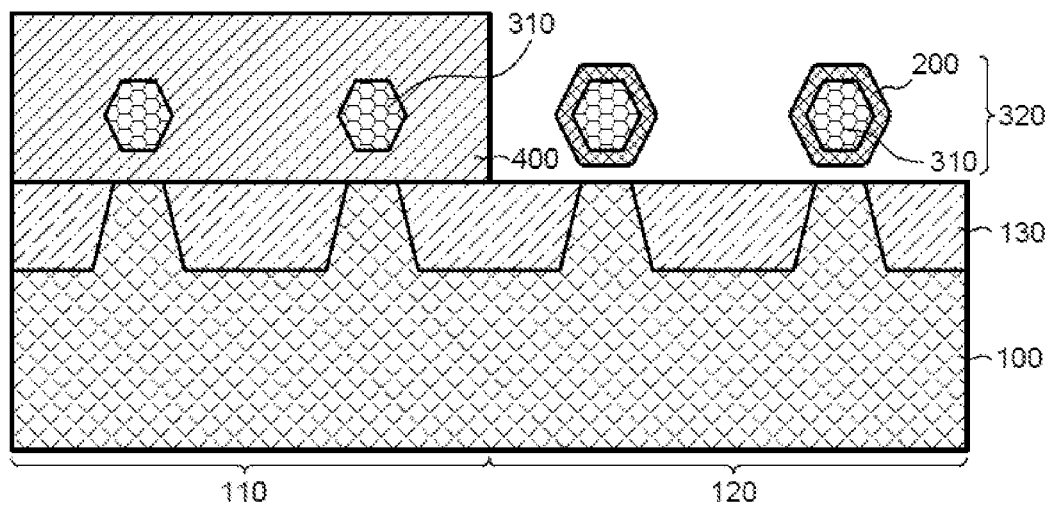
FIG. 6 and FIG. 7 are cross-sectional views showing forming a plurality of second hexagonal epitaxial wires on the NMOS active region according to one embodiment of the present disclosure.
Figure 7:
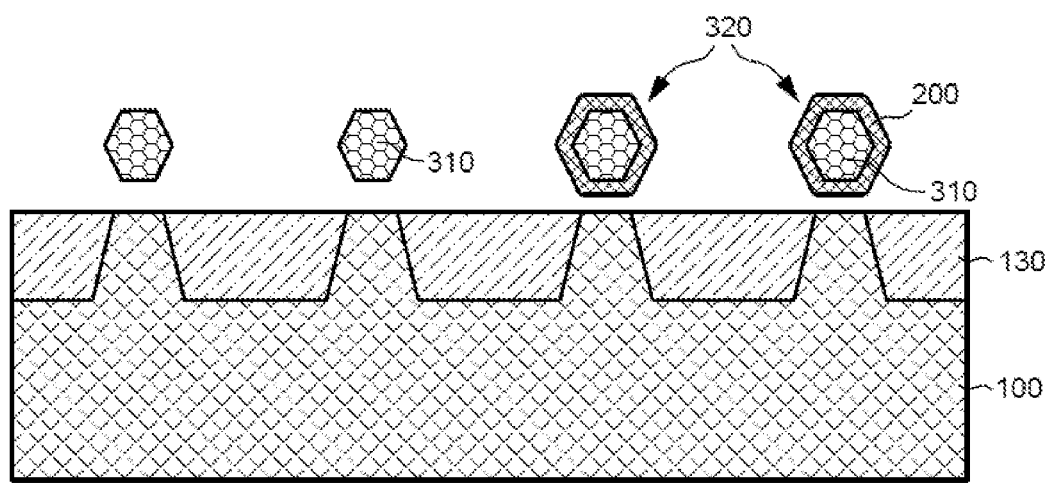

Performing step S4: Referring to FIG. 6 and FIG. 7, forming a plurality of second hexagonal epitaxial wires 320 on the NMOS active region 120 by selective epitaxially growing a III-V semiconductor crystal material 200 surrounding the pluralities of first hexagonal epitaxial wires 310 on the NMOS active region 120, in which the pluralities of second hexagonal epitaxial wires 320 are as a plurality of second nanowires. In one embodiment, the III-V semiconductor crystal material 200 could be Indium Arsenide (InAs) or Indium Gallium Arsenide (InGaAs). In one embodiment, the III-V semiconductor crystal material 200 is grown by CVD process, MOCVD process, MBE process or ALD process. In one embodiment, the step S4 further comprises forming a hard mask on the PMOS active region 110 to shade the PMOS active region 110 (as shown in FIG. 6) before growing the III-V semiconductor crystal material 200, so as to prevent the III-V semiconductor crystal material 200 from growing on the pluralities of first hexagonal epitaxial wires 310 on the PMOS active region 110. After growing the pluralities of second hexagonal epitaxial wires 320, the hard mask on the PMOS active region 110 is removed by etching process.

Figure 8:
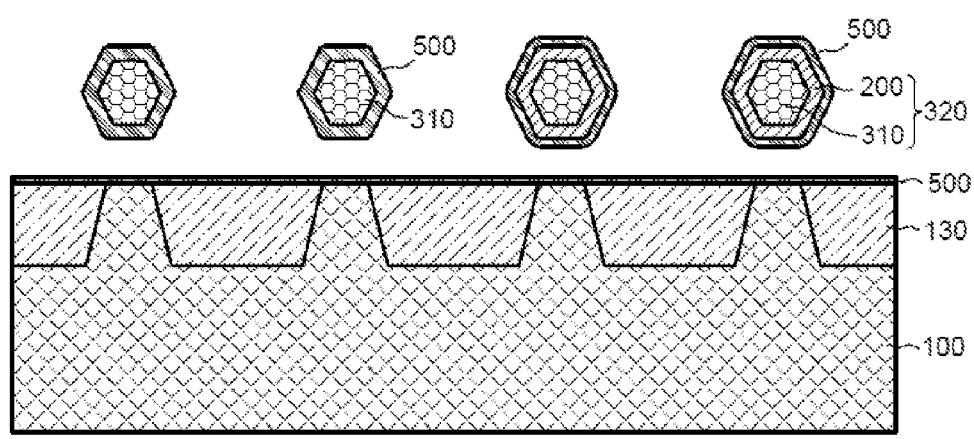
FIG. 8 is a cross-sectional view showing depositing a dielectric material on the pluralities of first hexagonal epitaxial wires and the pluralities of second hexagonal epitaxial wires according to one embodiment of the present disclosure.

Performing step S5: Referring to FIG. 8, depositing a dielectric material 500 on the pluralities of first hexagonal epitaxial wires 310 and the pluralities of second hexagonal epitaxial wires 320, in which the dielectric material 500 covers the pluralities of first hexagonal epitaxial wires 310 and the pluralities of second hexagonal epitaxial wires 320. In one embodiment, the dielectric material 500 has high dielectric constant, such as $TiO_2$, $HfO_2$, $ZrO_2$ and so on. In one embodiment, the dielectric material 500 is deposited by ALD process, CVD process or MOCVD process.

Figure 9:
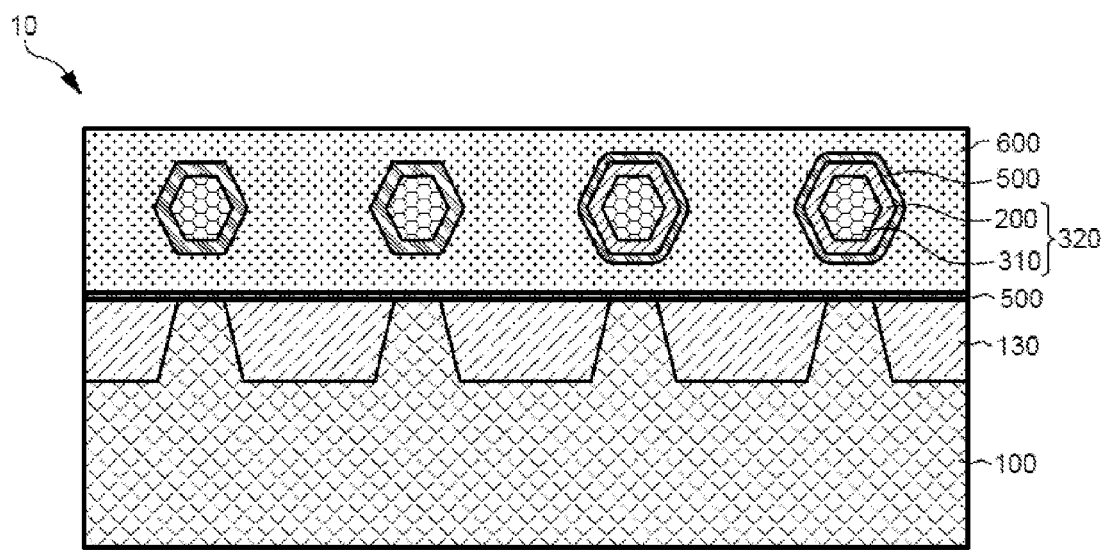
FIG. 9 is a cross-sectional view showing depositing a conducting material on the dielectric material according to one embodiment of the present disclosure.

Performing step S6: Referring to FIG. 9, depositing a conducting material 600 on the dielectric material 500 for forming a gate electrode surrounding the pluralities of first hexagonal epitaxial wires 310 and the pluralities of second hexagonal epitaxial wires 320. In one embodiment, the gate electrode is patterned by lithograph and etching.

Correspondingly, referring to FIG. 9 again, a complementary nanowire semiconductor device 10 fabricated by above mentioned steps comprises a substrate 100, a germanium (Ge) crystal material, a III-V semiconductor crystal material 200, a dielectric material 500 and a conducting material 600. The substrate 100 has a NMOS active region 120, a PMOS active region 110 and a shallow trench isolation (STI) region 130. The Ge crystal material is formed on the NMOS active region 120 and the PMOS active region 110 as a plurality of first hexagonal epitaxial wires 310. The III-V semiconductor crystal material 200 is surrounding the pluralities of first hexagonal epitaxial wires 310 on the NMOS active region 120 as a plurality of second hexagonal epitaxial wires 320. The dielectric material 500 covers the pluralities of first hexagonal epitaxial wires 310 and the pluralities of second hexagonal epitaxial wires 320. The conducting material 600 covers the dielectric material 500 for forming a gate electrode surrounding the pluralities of first hexagonal epitaxial wires 310 and the pluralities of second hexagonal epitaxial wires 320, and the pluralities of first hexagonal epitaxial wires 310 are a plurality of first nanowires and the pluralities of second hexagonal epitaxial wires 320 are a plurality of second nanowires.

While various embodiments in accordance with the disclosed principles been described above, it should be understood that they are presented by way of example only, and are not limiting. Thus, the breadth and scope of exemplary embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention (s), and their equivalents, that are protected thereby. In all instances, the scope of such claims shall be considered on their own merits in light of this disclosure, but should not be constrained by the headings herein.

What is claimed is:

1. A complementary nanowire semiconductor device fabricated by a method, comprising:
   providing a substrate, wherein the substrate has an NMOS active region, a PMOS active region and a shallow trench isolation (STI) region;
   forming a plurality of first hexagonal epitaxial wires on the NMOS active region and the PMOS active region by selective epitaxially growing a germanium (Ge) crystal material;
   selectively etching the substrate to suspend the pluralities of first hexagonal epitaxial wires on the substrate;
   forming a plurality of second hexagonal epitaxial wires on the NMOS active region by selective epitaxially growing a III-V semiconductor crystal material surrounding the pluralities of first hexagonal epitaxial wires on the NMOS active region;
   depositing a dielectric material on the pluralities of first hexagonal epitaxial wires and the pluralities of second hexagonal epitaxial wires, wherein the dielectric material covers the pluralities of first hexagonal epitaxial wires and the pluralities of second hexagonal epitaxial wires; and
   depositing a conducting material on the dielectric material for forming a gate electrode surrounding the pluralities of first hexagonal epitaxial wires and the pluralities of second hexagonal epitaxial wires, wherein the pluralities of first hexagonal epitaxial wires are a plurality of first nanowires and the pluralities of second hexagonal epitaxial wires are a plurality of second nanowires;
   the device comprising:
   the substrate, wherein the substrate has the NMOS active region, the PMOS active region and the shallow trench isolation (STI) region;
   the germanium (Ge) crystal material, formed on the NMOS active region and the PMOS active region as the plurality of first hexagonal epitaxial wires;
   the III-V semiconductor crystal material, wherein the III-V semiconductor crystal material surrounding the pluralities of first hexagonal epitaxial wires on the NMOS active region as the plurality of second hexagonal epitaxial wires;
   the dielectric material, wherein the dielectric material covers the pluralities of first hexagonal epitaxial wires and the pluralities of second hexagonal epitaxial wires; and
   the conducting material, wherein the conducting material covers the dielectric material for forming the gate electrode surrounding the pluralities of first hexagonal epitaxial wires and the pluralities of second hexagonal epitaxial wires, and the pluralities of first hexagonal epitaxial wires are the plurality of first nanowires and the pluralities of second hexagonal epitaxial wires are the plurality of second nanowires.

2. The device according to claim 1, wherein the pluralities of first hexagonal epitaxial wires are in prismatic shape.

3. The device according to claim 1, wherein the length of each first hexagonal epitaxial wire is between 2 nm and 50 nm.

4. The device according to claim 1, wherein the diameter of each first hexagonal epitaxial wire is between 2 nm and 5 nm.

5. The device according to claim 1, wherein the pluralities of first hexagonal epitaxial wires are a plurality of Ge nanowires.

6. The device according to claim 5, wherein the percentage of the Ge content in the pluralities of Ge nanowires is between 65% and 100%.

7. The device according to claim 1, wherein the III-V semiconductor crystal material is Indium Gallium Arsenide (InGaAs).

* * * * *